United States Patent
Hu (10) Patent No.: US 12,408,365 B2
(45) Date of Patent: Sep. 2, 2025

(54) HETEROSTRUCTURE TRANSISTOR GATE WITH DIFFUSION BARRIER

(71) Applicant: NXP USA, Inc., Austin, TX (US)

(72) Inventor: Jie Hu, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 379 days.

(21) Appl. No.: 18/059,402

(22) Filed: Nov. 28, 2022

(65) Prior Publication Data

US 2024/0178278 A1 May 30, 2024

(51) Int. Cl.
*H10D 30/47* (2025.01)
*H10D 30/01* (2025.01)
*H10D 64/64* (2025.01)

(52) U.S. Cl.
CPC ......... *H10D 30/475* (2025.01); *H10D 30/015* (2025.01); *H10D 64/64* (2025.01)

(58) Field of Classification Search
CPC .............. H10D 30/015; H10D 30/475; H10D 30/4755; H10D 64/64; H10D 64/518
See application file for complete search history.

(56) References Cited

U.S. PATENT DOCUMENTS

| | | | |
|---|---|---|---|
| 5,686,325 A * | 11/1997 | Moriuchi | H10D 30/4755 438/572 |
| 5,970,328 A | 10/1999 | Park et al. | |
| 7,934,620 B2 | 5/2011 | Stribling et al. | |
| 8,592,878 B2 | 11/2013 | Green et al. | |
| 9,054,167 B2 | 6/2015 | Saunier | |
| 9,449,833 B1 | 9/2016 | Regan et al. | |
| 2011/0278590 A1 | 11/2011 | Mieczkowski et al. | |
| 2012/0228675 A1 | 9/2012 | Heikman et al. | |
| 2013/0234278 A1* | 9/2013 | Hagleitner | H10D 30/475 257/473 |
| 2017/0213904 A1* | 7/2017 | Na | H10D 30/4755 |
| 2020/0083167 A1* | 3/2020 | LaRoche | H10D 30/475 |
| 2020/0168709 A1* | 5/2020 | Birner | H10D 30/475 |
| 2020/0194579 A1* | 6/2020 | Iucolano | H10D 30/475 |
| 2021/0125834 A1 | 4/2021 | Lucolano et al. | |
| 2024/0105824 A1* | 3/2024 | Bothe | H10D 30/475 |
| 2024/0266428 A1* | 8/2024 | Kanda | H10D 30/475 |

OTHER PUBLICATIONS

Fanning, D. et al; "Dielectrically defined optical T-gate for high power GaAs pHEMTs"; GaAsMANTECH, Inc.; retreived from the Internet https://citeseerx.ist.psu.edu/viewdoc/download?doi=10.1.1. 566.7864&rep=rep1&type=pdf on Apr. 17, 2022); 4 pages (2002).
Peralagu, U. et al;"CMOS-compatible GaN-based devices on 200mm-Si for RF applications: integration and performance"; IEEE Int'l Electron Devices Meeting; 4 pages (2019).

* cited by examiner

Primary Examiner — Peter M Albrecht (57) ABSTRACT

A heterostructure-based high electron mobility transistor includes a channel region in which a two-dimensional electron gas is formed which is protected by insulating material. A control terminal contacts the channel region within an aperture in the insulating material. The control terminal includes a first metal layer that forms a Schottky contact to the channel region within the aperture and a gate electrode which overlies the first metal layer and the channel region and extends above the channel region adjacent to the aperture.

8 Claims, 7 Drawing Sheets

HETEROSTRUCTURE TRANSISTOR GATE WITH DIFFUSION BARRIER

FIELD OF THE INVENTION

Embodiments of the subject matter described herein relate to field-effect transistors and methods of fabrication of such transistors.

BACKGROUND OF THE INVENTION

Transistor-based circuits are often used for analog signal processing applications including amplification of radio and microwave-frequency (RFMW) signals and for power-switching. Advanced transistor designs and high-performance materials such as III-V semiconductors have been used to achieve increased power densities while providing acceptable thermal performance and voltage-induced breakdown characteristics. However, highly-scaled devices may be more susceptible to leakage, breakdown, and other problems. Transistors based on Gallium Nitride (GaN) and/or other compound semiconductors are often used in applications where highly-scaled silicon transistors cannot provide adequate switching speeds or power handling capabilities.

SUMMARY OF THE INVENTION

In an example embodiment, a transistor includes a semiconductor substrate having a top surface and a bottom surface; a first current terminal; a second current terminal; and a channel region. The channel region is formed at a top surface of the semiconductor substrate and includes a semiconductor heterostructure configured to form a two-dimensional electron gas (2DEG) at a buried semiconductor heterojunction within the semiconductor heterostructure. The 2DEG is configured to provide an electrically conductive path between the first current terminal and the second current terminal.

Electrically-insulating material is disposed above the channel region and in direct physical contact with channel region. An aperture in the electrically insulating material is disposed at a location between the first current terminal and the second current terminal. An electrically-conductive control terminal electrically contacts the channel region within the aperture. The control terminal includes: a first metal layer having a first thickness and formed directly above the channel region and a metal gate electrode having a second thickness that is greater than the first thickness disposed above the first metal layer that forms an Ohmic contact to the first metal layer. The first metal layer forms a Schottky contact to the channel region.

In one or more embodiments, the first metal layer is configured to impede atomic diffusion from the metal gate electrode to the channel region.

In another example embodiment, a method of forming a transistor includes receiving a semiconductor substrate having a top surface and a bottom surface and a channel region. The channel region is formed at a top surface of the semiconductor substrate and includes a semiconductor heterostructure configured to form a two-dimensional electron gas (2DEG) at a buried semiconductor heterojunction within the semiconductor heterostructure. The 2DEG is configured to provide an electrically conductive path between a first current terminal and a second current terminal.

The method further includes forming electrically-insulating material is disposed above the channel region and in direct physical contact with channel region. The method further includes forming an aperture in the electrically insulating material disposed at a location between the first current terminal and the second current terminal. The method further includes forming an electrically-conductive control terminal that electrically contacts the channel region within the aperture. The control terminal includes: a first metal layer having a first thickness and formed directly above the channel region and a metal gate electrode having a second thickness that is greater than the first thickness disposed above the first metal layer that forms an Ohmic contact to the first metal layer. The first metal layer forms a Schottky contact to the channel region.

BRIEF DESCRIPTION OF THE SEVERAL VIEWS OF THE DRAWINGS

The present disclosure is illustrated by way of examples, embodiments, and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein.

DETAILED DESCRIPTION

The following detailed description provides examples for the purposes of understanding and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and in the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Directional references such as "top," "bottom," "left," "right," "above," "below," and so forth, unless otherwise stated, are not intended to require any preferred orientation, and are made with reference to the orientation of the corresponding figure or figures for purposes of illustration.

It will be appreciated that the steps of various processes described herein are non-limiting examples of suitable processes according to embodiments and are for the purposes of illustration. Devices and methods according to embodiments herein may use any suitable processes including those that omit steps described herein, perform those steps and similar steps in different orders, and the like. It will also be appreciated that well-known steps or other well-known process features may be omitted for clarity.

It will be appreciated that, unless explicitly stated otherwise, the term "approximately", when used referring to lateral and vertical dimensions of structures formed using semiconductor fabrication techniques or related techniques means that the dimension or range of dimensions is subject to variations that are within the expected tolerance(s) of the processes used.

Figure 1A:
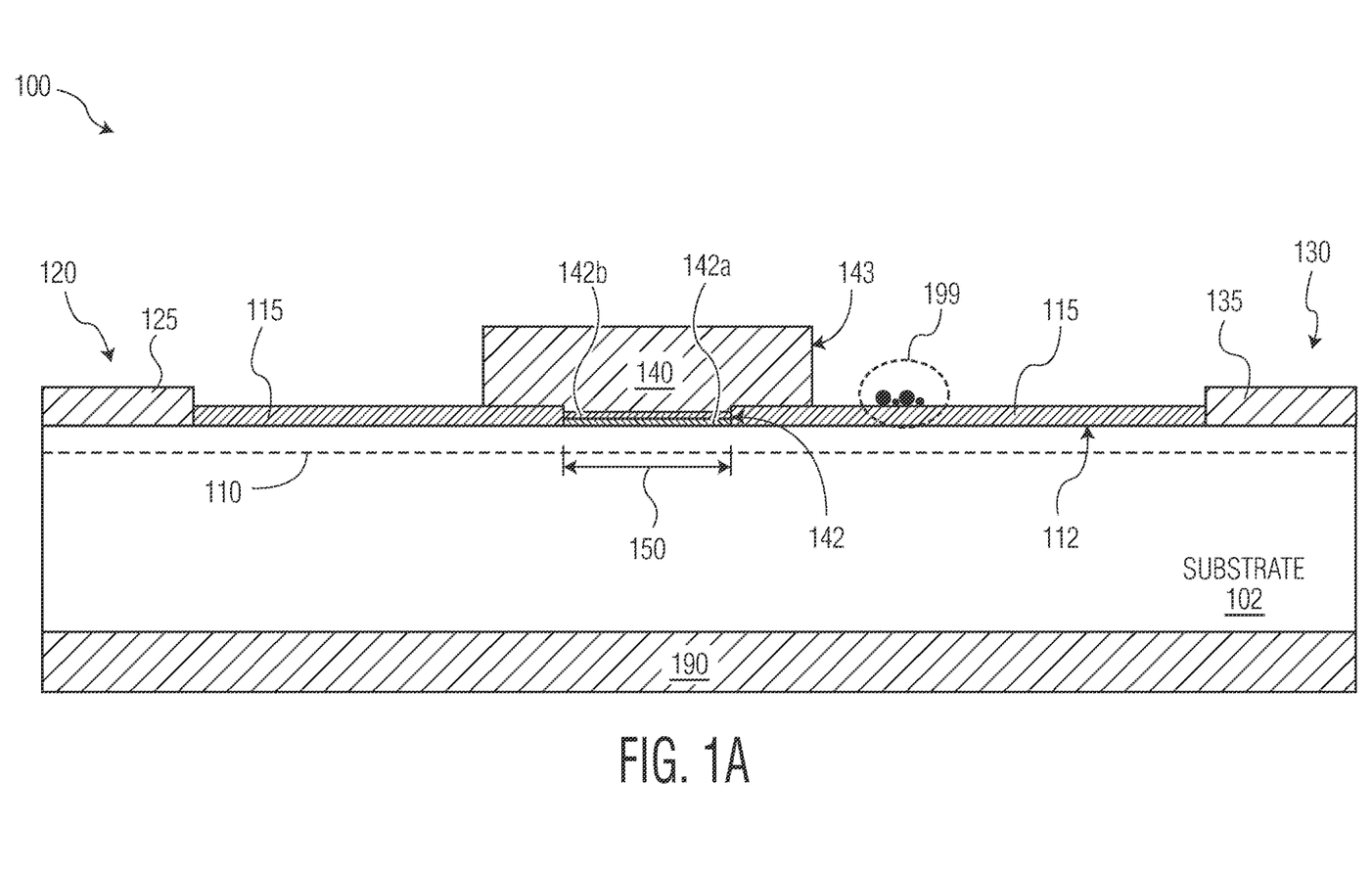
FIG. 1A is a cross-sectional schematic view of an example transistor.

FIG. 1A is a cross-sectional schematic view of an example transistor 100. The transistor 100 is formed on a semiconductor substrate 102 and has a channel region 110 near a top surface 112 of the substrate 102. The transistor 100 includes a first current terminal 120 (provided with a contact 125 which may be a metal or other suitable electrically conductive material) electrically coupled to a first end of the channel region 110 and a second current terminal 130 (provided with a contact 135) electrically coupled to a second end of the channel region 110 opposite the first current terminal 120. The transistor 100 also has a control terminal (a gate electrode 140) disposed above the channel region 110 in between the first current terminal 120 and the second current terminal 130. A dielectric material 115 is disposed above the top surface 112 overlying the channel region 110. The first current terminal 120 and the second current terminal 130 may be formed by any suitable method. For example, the current terminals may be formed by degenerately doped regions within the semiconductor substrate 102, or by metallic contacts deposited within recesses in the substrate 102 or on the surface of the substrate 102 (e.g., the contact 125 and the contact 135) such that they contact portions of the channel region 110 that are conductive when the transistor 100 is in an 'on' state.

The gate electrode 140 contacts the channel region 110 through an aperture 150 in the dielectric material 115. As shown, the gate electrode 140 may have a first portion 142 that contacts the channel region 110 within the aperture and optionally may have a second portion 143 that overhangs the dielectric material 115. Although the gate electrode 140 is depicted as having vertical sidewalls, it will be understood that the gate electrode 140 and similar structures herein may have any suitable geometry. For instance, the first portion 142 of the gate electrode 140 may have sidewalls that are curved or slanted. Similarly, the second portion 143 of the gate electrode 140 may have sidewalls that are curved or slanted and the top of the gate electrode 140 (farthest from the channel region 110) may have any suitable geometry.

It will be appreciated that the first current terminal 120 may be operated, for example, as a source terminal of the transistor 100 and the second current terminal 130 may be operated, for example, as a drain terminal of the transistor 100. It also be understood that the gate electrode 140 is suitable for use as a gate electrode of the transistor 100 such that, when gate electrode 140 is held at a suitable electrical potential, the channel region 110 is configured to provide an electrically conductive path between the first current terminal 120 and the second current terminal 130. It will be understood that in transistors such as the transistor 100, the channel region 110 may be conduct when no bias voltage is applied and that the channel region may cease to conduct when a suitably large bias voltage is applied to the gate electrode 140. The backside of the substrate 102 can be electrically conductive and, as shown, may include a backside metallization layer 190 which can be bonded to a heat sink. In some applications the backside of the substrate 102 may also be connected to the source or drain terminal of transistors using through-wafer vias.

The transistor 100 above (and transistors according to one or more embodiments) may represent transistors implemented using various transistor technologies. For instance, the transistor 100 may be a III-V compound semiconductor-based high electron-mobility transistor ("HEMT"), otherwise known as a heterostructure field effect transistor ("HFET"). In such transistors the effective semiconductor channel may be a 2D electron gas ("2DEG") formed at a semiconductor heterojunction disposed with the channel region 110 according to known techniques. Along these lines, the transistor 100 may be a gallium-nitride (GaN) based HEMT. In such transistors, a 2DEG is formed at an interface between a GaN layer and an aluminum-containing layer with a stochiometric composition described by the chemical formula $Al_xGa_{1-x}N$. It will be understood that, in such transistors and related heterostructure-based transistors, the effective channel through which current is conducted may be buried within the channel region 110 and may not extend to the top surface 112 above the channel region 110.

Figure 1B:
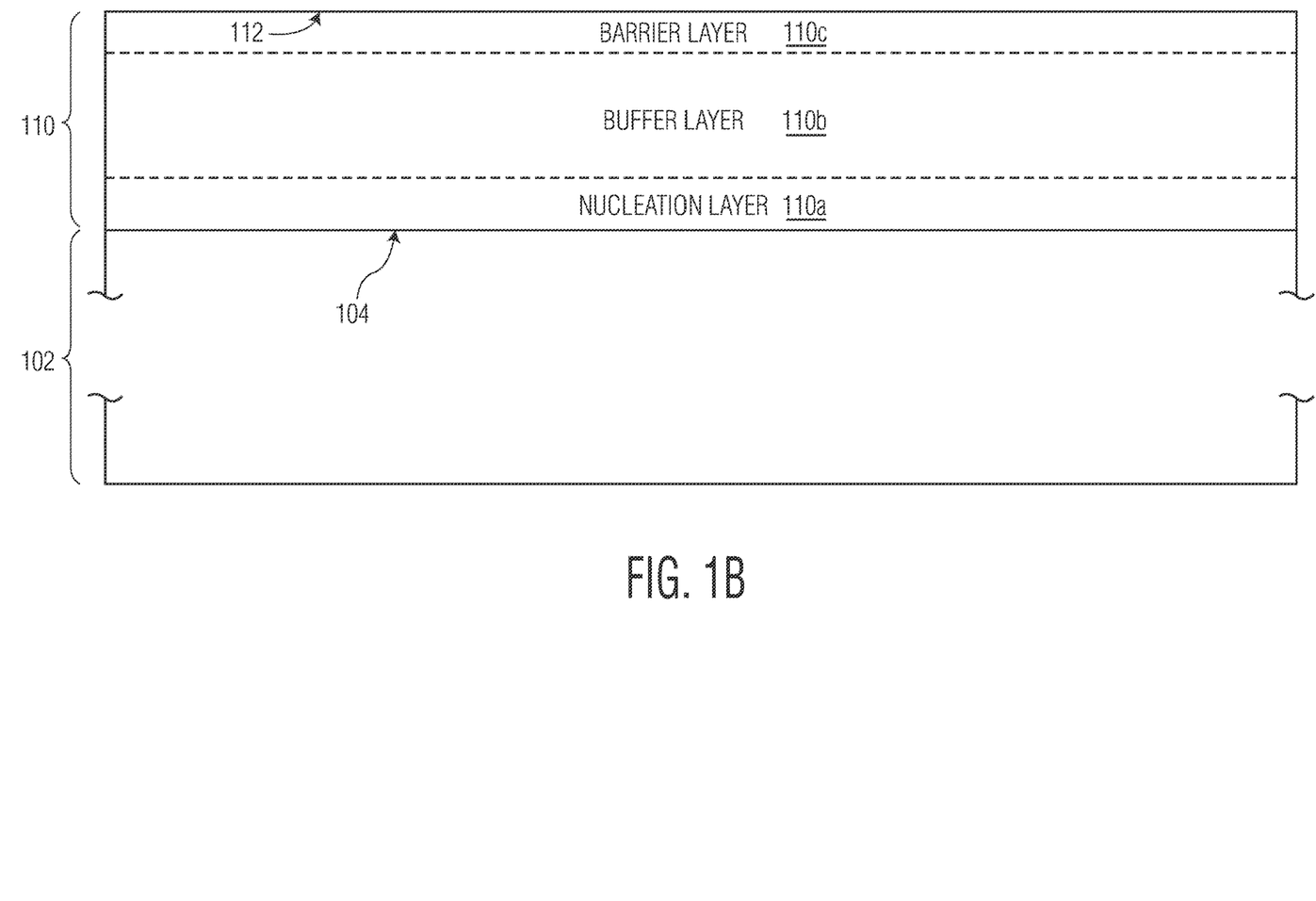
FIG. 1B is a cross-sectional schematic of semiconductor heterostructure forming a channel region of the example transistor of FIG. 1A.

In one or more embodiments, the dielectric material 115 may be a material that provides surface passivation for the channel region 110. For instance, the dielectric material 115 may be a silicon nitride passivation layer over a GaN-based heterostructure. It will be further understood that, in one or more embodiments where a channel region such as the channel region 110 is formed by a semiconductor heterostructure (as illustrated in FIG. 1B), that the top surface of a semiconductor substrate (e.g., the semiconductor substrate 102) will be defined herein for the purposes of a surface of the substrate above which the heterostructure is formed, as opposed the top surface 112 of the channel region 110. In some transistors such as the transistor 100, the source or drain may be coupled to a conductive layer such as the backside metallization layer 190 shown in FIG. 1A.

In transistors such as the transistor 100, it is often desirable to use metals such as gold to form gate electrodes such as the gate electrode 140. Often, other metal layers are deposited via thermal evaporation or similar methods over the channel region 110 (e.g., the metal layer 142a and the metal layer 142b shown in FIG. 1A) prior to deposition of a much thicker metal layer (e.g., gold). For example, the metal layer 142a and the metal layer 142b may be deposited prior to forming the gate electrode 140. The metal layer 142a in such structures is often nickel, chosen to form a Schottky contact to an aluminum/gallium nitride (AlGaN) layer forming the top of the channel region 110, followed by platinum for the metal layer 142b, chosen to form an Ohmic contact between the gate electrode 140 and the metal layer 142a.

FIG. 1B is cross-sectional schematic view of the channel region 110 formed on the substrate 102 from a semiconductor heterostructure that includes three layers which will be described in the context of a GaN HEMT as an example. In this simplified example, the channel region 110 is formed from a nucleation layer 110a (e.g., a layer of aluminum nitride) formed on the top surface 104 of the substrate 102, followed a by a buffer layer 110b (e.g., an epitaxial layer of gallium nitride), and a barrier layer 110c (e.g., an insulating aluminum nitride/gallium nitride alloy) in which a 2DEG is formed at the interface between the buffer layer 110b and the barrier layer 110c. Typically, for GaN HEMT devices, the substrate 102 may be silicon, silicon carbide, sapphire or any other suitable material).

It will be understood that the example transistor 100 as shown in FIG. 1A and depictions of other transistors herein may omit certain features that depend upon the underlying semiconductor technology used to realize the example transistor 100. For example, if the example transistor 100 is a HEMT and the channel region 110 is as shown in FIG. 1B, then contact 125 and the contact 135 may be disposed to beyond the top surface 112 of the channel region 110 in order to contact the 2DEG formed at the interface between the barrier layer 110c and the buffer layer 110b. It will be understood that additional layers may be present at the interface between the buffer layer 110b and the barrier layer 110c in order to form the 2DEG.

HEMTs and other transistors with structures similar to the transistor 100 with a channel similar to the channel region 110 as depicted in FIG. 1B may have disadvantages in particular applications. In some instances, conventional fabrication techniques may result in residual metal from the formation of the gate electrode 140 at undesired locations above the top surface 112 and/or above or within the dielectric material 115, as illustrated by the particles depicted in the region 199 of FIG. 1A. In other instances, metal (e.g., gold) from the gate electrode 140 may be prone to unwanted diffusion toward the channel region 110 or may form undesirable alloys with metals found in the metal layers 142a, 142b or other materials used to promote metal adhesion at the interface between the gate electrode 140 and the top surface 112 of the channel region.

Deposition of metals such as the metal layers 142a and 142b as shown in FIG. 1A can introduce problems as the dimensions of devices become smaller (e.g., when the gate length is on the order of a few hundred nanometers or less) and when the thickness of layers such as the metal layers 142a, 142b approach tens of nanometers or fewer. For example, when thin (i.e., <100 nm) layers of nickel are deposited by thermal evaporation and similar methods, followed by deposition of similarly thin layers of platinum at least two problems have been observed. First, the metal layer 142b (e.g., platinum) may have poor (i.e., non-conformal) coverage of the side-walls of the aperture 150. This can lead to unwanted atomic diffusion of metal atoms (e.g., gold atoms) from the gate electrode 140 toward the channel region 110 which can result in undesirable alloying of material from the gate electrode 140 with material in the metal layer 142a or other defects which can lead to reduced device performance or premature failure. Additionally, metal deposition processes such as thermal evaporation followed by "lift-off" of undesired metal can produce unwanted metal contaminants (represented by small particles in the region 199 of FIG. 1A which can also cause unpredictable device performance or early failures. These two problems are addressed by one or more embodiments as described below.

Figure 2:
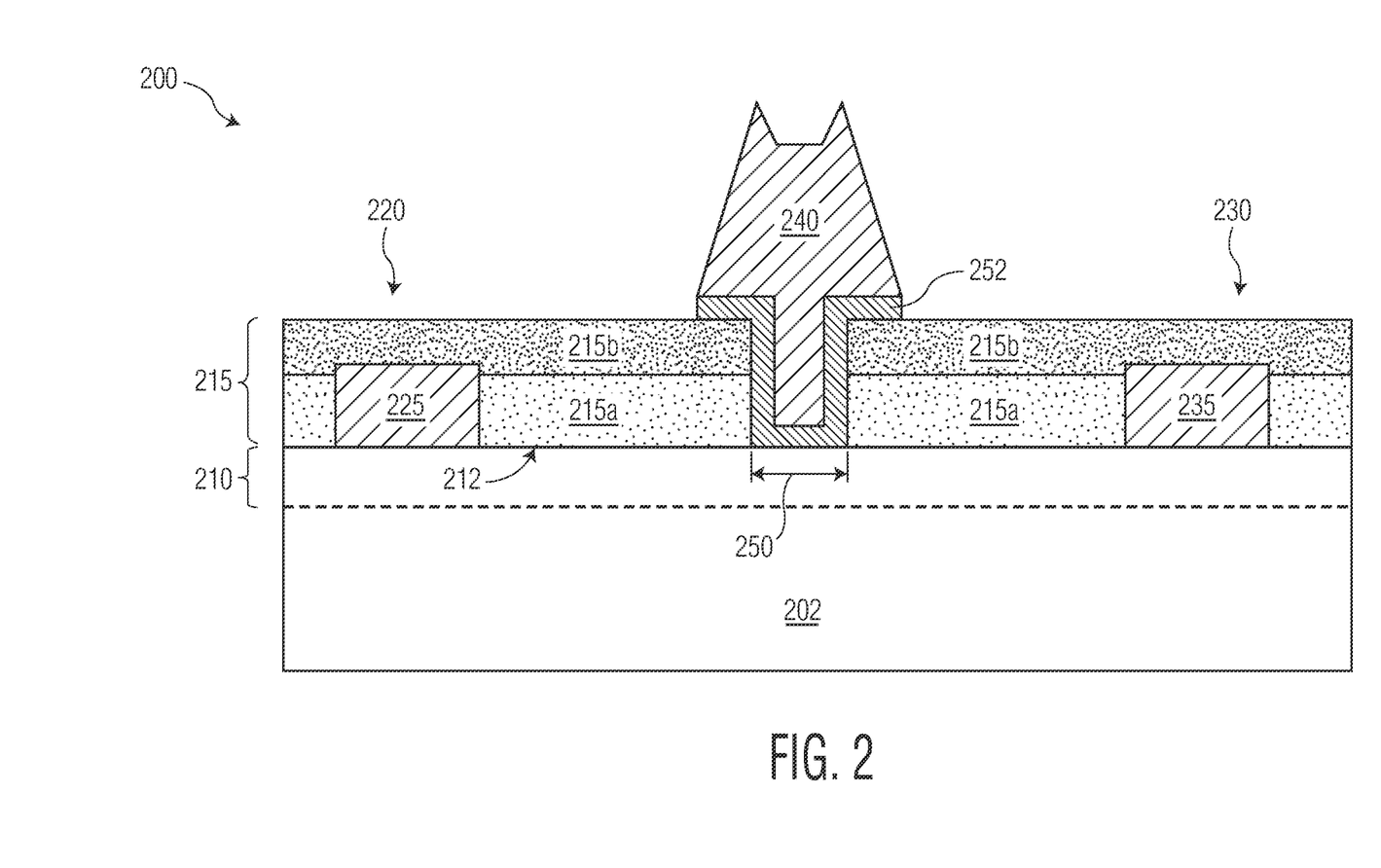
FIG. 2 is a cross-sectional schematic view of an example transistor according to one or more embodiments.

FIG. 2 shows an example transistor according to one or more embodiments. The transistor 200 is a HEMT device with a heterostructure based-channel such as the channel region 110 as described in connection with FIG. 1B. The transistor 200 is formed on a substrate 202 (e.g., the semiconductor substrate 102) with a channel region 210 (e.g., the channel region 110) having a top surface 212, a source terminal 220 (e.g., a first current terminal 120) with a contact 225 (e.g., a contact 125) and a drain terminal 230 (e.g., a second current terminal 130) with a contact 235 (e.g., a contact 135), as well as a gate electrode 240 (e.g., a gate electrode 140) and a dielectric material 215 (e.g., a dielectric material 115) over the channel region 210. In this example, the dielectric material 215 includes a first layer 215a and second layer 215b as shown. However, it will be understood that any suitable number and arrangement of layers can be used.

As shown, the gate electrode 240 has a 'T' or 'mushroom' shape in which a lower portion disposed within an aperture 250 in the dielectric material 215 and a wider upper portion that overhangs the channel region 210 to either side of the recess 250. As shown, the recess is lined with a metal layer 252 through which the gate electrode 240 contacts the channel region 210. The metal layer 252 is configured to form a suitable Schottky contact to the channel region 210 and a suitably Ohmic contact to the gate electrode 240, allowing the transistor to be switched between an 'on' state in which a conductive path is formed between the source and drain contacts 225, 235 via the channel region 210 and an 'off' state in which the channel region 210 prevents the flow of electrical current from one contact to another in response to proper biasing of the gate electrode 240.

The composition and arrangement of the metal layer 252 is configured to impede atomic diffusion from the gate electrode 240 toward (and into) the channel region 210. In one or more embodiments, the gate electrode 240 includes gold and the metal layer 252 is disposed between the gate electrode and the channel region 210. In such embodiments, the metal layer 252 is configured to impede the diffusion of gold atoms from the gate electrode 240 toward the channel region 210. As shown, the metal layer 252 is a continuous layer that is conformal with the bottom and sidewalls of the aperture 250.

The metal layer 252 may be any suitable conductive material and may have any suitable thickness. Non-limiting examples of suitable metals for GaN-based HEMTs include titanium alloys (e.g., TIN, TiW, TiWN), tantalum alloys (e.g., TaN and TaAlN) and platinum (Pt) as these materials have suitable differences in work functions with GaN-based HEMT channels to form a suitable Schottky contact to the channel region 210 and a suitably Ohmic contact to the gate electrode 240.

In one or more embodiments, the metal layer 252 has a thickness of less than 50 nanometers. In one or more embodiments, the metal layer 252 has a thickness of approximately 15-30 nm. In or more embodiments, the metal layer 252 has a thickness less than 15 nm. As will be discussed further in connection with FIG. 3, the metal layer 252 may be deposited using any suitable process for depositing a conformal film in which the thickness of the metal layer 252 along vertical or partially vertical surfaces of the aperture 250 is similar to the thickness of the metal layer 252 directly above the channel region 210 within the aperture 250.

Figure 3:
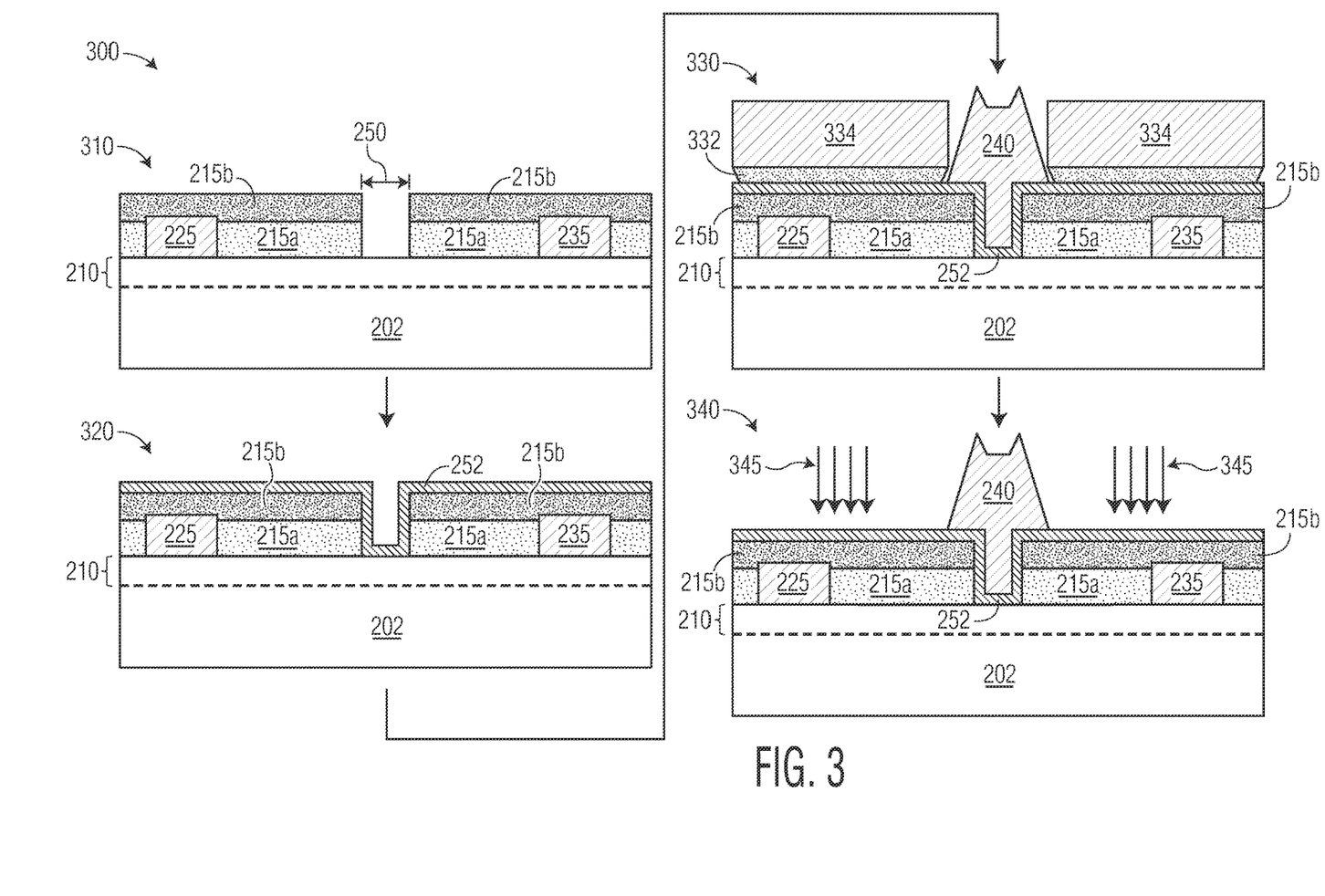
FIG. 3 is schematic diagram illustrating steps in an example process according to one or more embodiments that is suitable for fabricating the transistor of FIG. 2 and related transistors.

FIG. 3 is a process flow diagram representing steps in an example process suitable for use in fabricating a transistor according to one or more embodiments (e.g., the example transistor 200). The process 300 includes steps 310, 320, 330, and 340 These steps are depicted in FIG. 3 being performed to fabricate the transistor 200 of FIG. 2.

It will be understood that certain details, such as details of well-known semiconductor fabrication processes, may be omitted for clarity and that multiple discrete steps may be represented in one step. It will be further understood that, in or more embodiments, steps of example processes described herein may be omitted or performed in a different order. Furthermore, it will be understood that although reference may be made to photoresist, that nothing herein is intended to exclude other techniques such as electron beam lithography, as one nonlimiting example.

At step 310, a semiconductor substrate (e.g., the substrate 202) is provided with a region suitable for use as a channel region at the top surface (e.g., a semiconductor heterostructure such as a channel region 110 or channel region 210). The dielectric material 215 is also present above the channel region 210. The aperture 250 is formed in the dielectric material 215 by any suitable method. For example, a resist may be patterned by photolithography, electron beam lithography, or the like to act as a mask with an opening over the desired location of the aperture 250, allowing the dielectric material 215 to be etched or otherwise removed. Alternatively, the dielectric material 215 may be deposited using a lift-off process in which the substrate 202 is shielded from material deposition by a resist or other sacrificial material at the desired location of the aperture 250.

At step 320, the metal layer 252 is deposited or otherwise formed by a process that results in a conformal coating of the sidewalls of the aperture 250 and the exposed surface of the channel region 210 within the aperture 250. It is desirable that the metal layer 252 is relatively thin so as not to significantly increase the gate resistance of the transistor 200, but sufficiently thick such that the layer is also continuous throughout to act as an effective barrier against unwanted diffusion of metal atoms from the gate electrode 240 which will be formed in subsequent steps.

In one or more embodiments, a metal layer such as the metal layer 252 is deposited using a suitably conformal physical vapor deposition (PVD such as sputtering. As one example, titanium can be reactively sputtered in a nitrogen environment to form TiN. In one or more embodiments, a metal layer such as the metal layer 252 is deposited using atomic layer deposition (ALD). As one nonlimiting example, platinum can be deposited via a thermal ALD process using a platinum-containing metal-organic compound as a precursor. As another nonlimiting example, TIN can be deposited via ALD process using titanium tetrachloride and ammonia precursors. In or more embodiments, a plasma-enhanced ALD process is used. Plasma-enhanced ALD processes can be performed at temperatures below 350° C. and may result in fewer impurities compared to thermal ALD processes.

At step 330, the gate electrode 240 is formed by any suitable process. In one or more embodiments, as pictured, the electrode 240 can be formed via a "lift-off" process in which a masking material 332 (e.g., photoresist) is patterned over the substrate 202 such that the area where the gate electrode 240 is formed is exposed. Metal is then deposited via any suitable process such as sputtering, thermal evaporation, or electroplating as non-limiting examples. The masking material 332 is then removed from the substrate 202, along with any undesired metal 334 deposited on the masking material 332.

At step 340, after the masking material 332 is removed, metal layer 252 is exposed, except in areas where the metal layer 252 underlies portions of the gate electrode 240 as shown. An etching process 345 (represented by vertical arrows) is then used to selectively remove the exposed portions of the metal layer 252. The etch process 345 may be any suitable process including, as nonlimiting examples, sputter etching, reactive ion etching (RIE), wet chemical etching, or the like. Forming the metal layer 252 and the gate electrode 240 as described herein allows the gate electrode 240 to be used as an etch mask to protect the portions of the metal layer 252 within the aperture 250.

It will be understood that, although the patterning of various layers (e.g., the metal layer 252 or the gate electrode 240) may be described using additive processes such as lift-off patterning, any suitable processes may be used, including, but not limited to subtractive processes in which a conductive material is first deposited over an entire area and then patterned subtractive an etching process or any other suitable processes.

Figure 4:
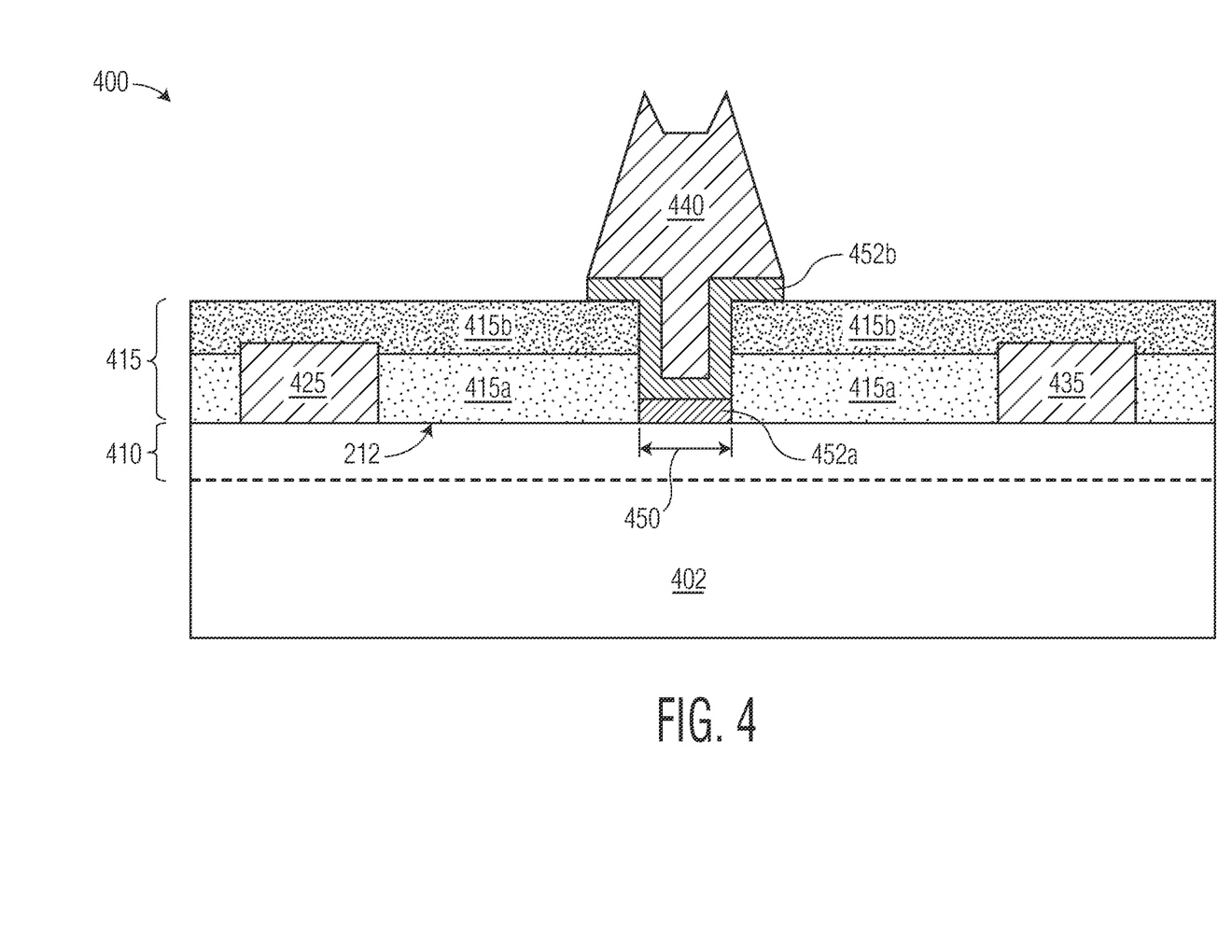
FIG. 4 is a cross-sectional schematic view of another example transistor according to one or more embodiments.

FIG. 4 shows an example transistor according to one or more embodiments. Like the transistor 200, the transistor 400 is a HEMT formed on a substrate 402 (e.g., a substrate 102/202) and has a heterostructure-based channel region 410 (e.g., a channel region 110/210) with contacts 425, 435 (e.g., contacts 225, 235) that can be operated as source and drain contacts, dielectric material 415 (e.g., dielectric material 215) that includes the dielectric material layers 415a, 415b over the channel region 410, and a gate electrode 440 (e.g., a gate electrode 140/240) coupled to the channel region 410. The transistor 400 differs from the transistor 200 in the presence of two distinct metal layers (a metal layer 452a and a metal layer 452b) between the gate electrode 440 and the channel region 410 as opposed to the single metal layer 252 of the transistor 200.

As shown, the metal layer 452a is confined to the area directly above the channel region 410 within the aperture 450 (e.g., the aperture 250) in the dielectric material 415 (i.e., the dielectric material layers 415a, 415b). The metal layer 452a (or other suitably conductive material) is configured to form a Schottky contact to the channel region 410 and an Ohmic contact the gate electrode 440 via an intervening metal layer 452b which (similarly to the metal layer 252 of the transistor 200) is conformal with the sidewalls of the aperture 450. In one or more embodiments the metal layer 452b is configured to impede atomic diffusion from the gate electrode 440 toward the channel region 410, analogously to the metal layer 252 of the transistor 200.

Figure 5:
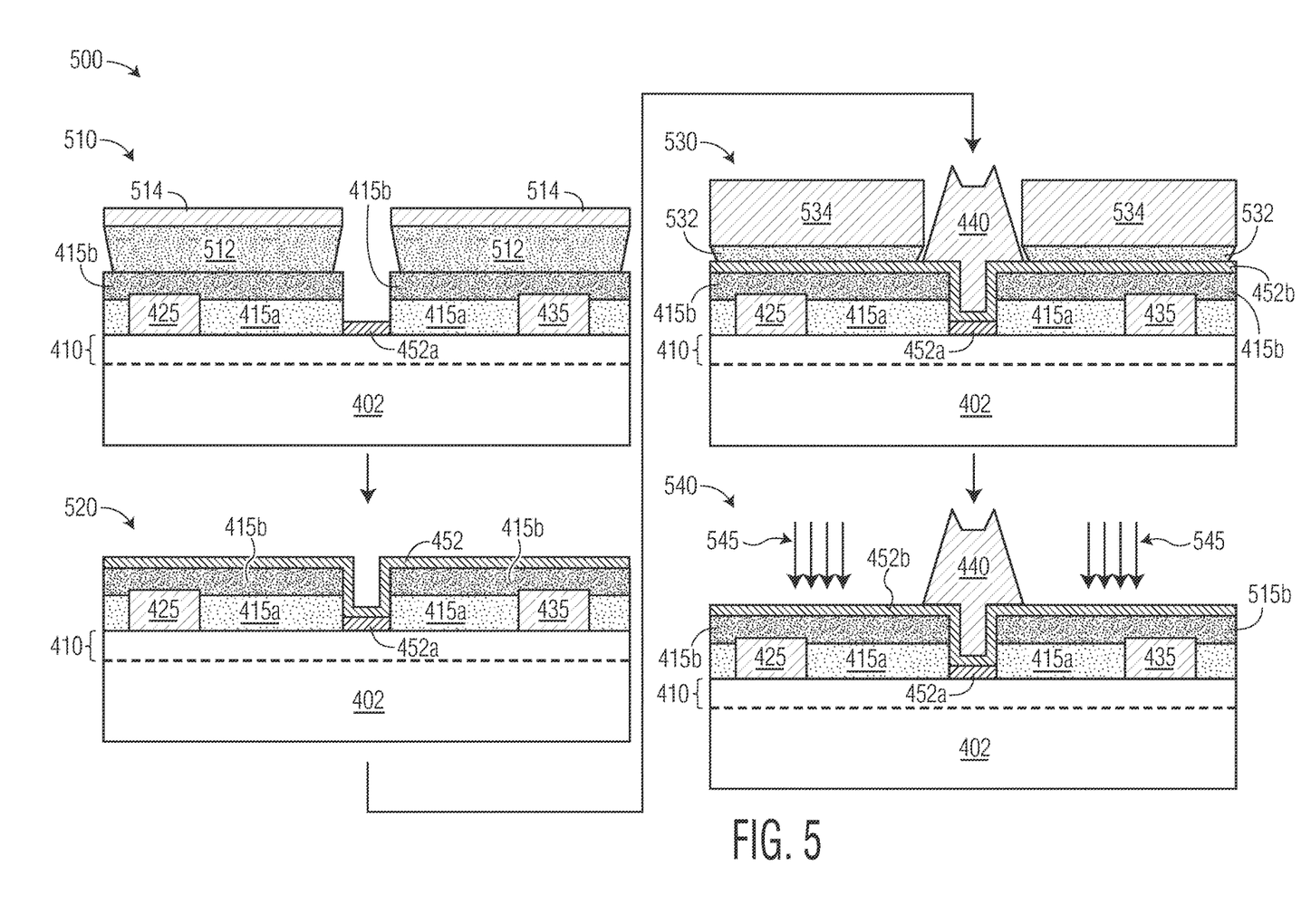
FIG. 5 is schematic diagram illustrating steps in an example process according to one or more embodiments that is suitable for fabricating the transistor of FIG. 3 and related transistors.

FIG. 5 is a process flow diagram representing an example process suitable for fabricating the transistor 400 and similar transistors. The process 500 has steps 510, 520, 530, and 540, which are illustrated in FIG. 5 with respect to formation of the transistor 400 as shown in FIG. 4.

At step 510, the semiconductor substrate 402 is provided with a semiconductor heterostructure forming the channel region 410 protected by dielectric material 415 (i.e., the dielectric material layers 415a, 415b) in which an aperture 450 has been formed. The metal layer 452a is formed above the channel region 410 within the aperture 450 by any suitable process. In this example, the metal layer 452a is deposited via a lift-off process in which the masking material 512 (e.g., masking material 312 such as photoresist) is patterned to expose the aperture 450. Metal is then deposited via any suitable process such as sputtering, thermal evaporation, or electroplating, as non-limiting examples. The masking material 512 is then removed from the substrate 502, along with any undesired metal 514 deposited on the masking material 512. Because gold is often used for gate electrodes and most metals suitable for use are more resistive than gold, it can be desirable that the metal layer 452a is thick enough to form a continuous layer. The metal layer 452a may be any suitable material, including nickel and platinum as nonlimiting examples.

At step 520, the metal layer 452b is deposited or otherwise formed over the metal layer 452a by a process that results in a conformal coating of the sidewalls of the aperture 450. When the gate electrode 440 is gold, it is desirable that the metal layer 452b is relatively thin so as not to significantly increase the gate resistance of the transistor 400, but that the layer is also continuous throughout to act as an effective barrier against unwanted diffusion of metal atoms from the gate electrode 440, formed later in the process 500. In one or more embodiments, a metal layer such as the metal layer 452b is deposited using a physical vapor deposition (PVD) process, such as those described above. In one or more embodiments, a metal layer such as the metal layer 452b is deposited using atomic layer deposition (ALD), such as those described above.

At step 530 (e.g., step 330 of the process 300) the gate electrode 440 is formed by any suitable process. In one or more embodiments, as pictured, the gate electrode 440 can be formed via a lift-off process in which a masking material 532 (e.g., photoresist) is patterned over the substrate 402 such that the area where the gate electrode 440 is to be formed is left exposed. Metal is then deposited via any suitable process such as sputtering, thermal evaporation, or electroplating as non-limiting examples. The masking material 532 is then removed from the substrate 402, along with any undesired metal 534 deposited on the masking material 532.

At step 540, after the masking material 532 has been removed, the metal layer 452b has been left exposed, except in areas where the metal layer 452b underlies portions of the gate electrode 440 as shown. An etching process 545 (e.g., the etching process 345, represented by vertical arrows) is then used to selectively remove the exposed portions of the metal layer 452b. The etching process 545 may be any suitable process including, as nonlimiting examples, sputter etching, reactive ion etching (RIE), wet chemical etching, or the like. Forming the metal layer 452b and the gate electrode 440 as described herein allows the gate electrode 440 to be used as an etch mask to protect the portions of the metal layer 452b within the aperture 450.

Figure 6:
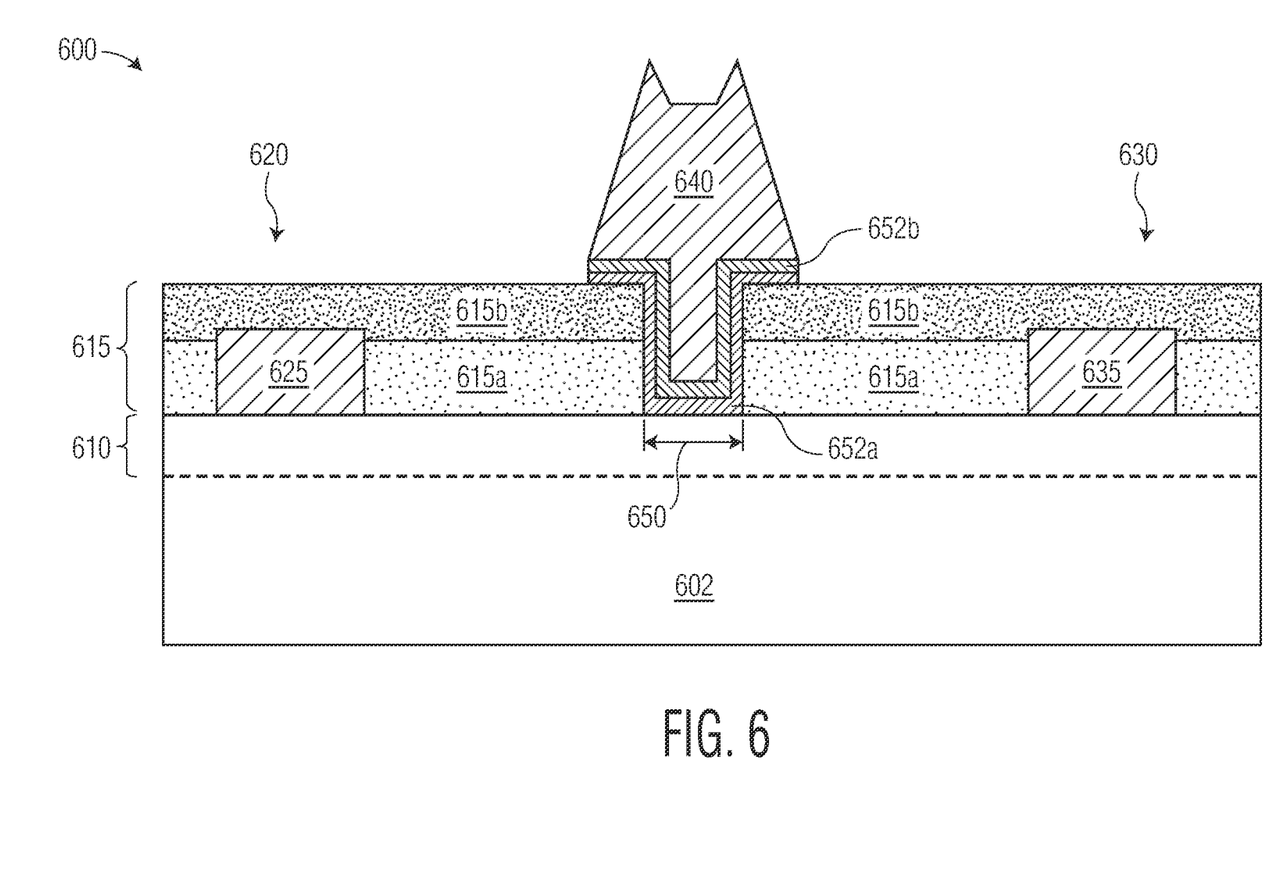
FIG. 6 is a cross-sectional schematic view of another example transistor according to one or more embodiments that is related to the example transistor of FIG. 3.

FIG. 6 shows an example transistor according to one or more embodiments. Similarly to the transistors 200 and 400, the transistor 600 is a HEMT formed on a substrate 602 (e.g., a substrate 102/202/402) and has a heterostructure-based channel region 610 (e.g., a channel region 110/210/410) with contacts 625, 635 (e.g., contacts 225, 235/425, 435) that can be operated as source and drain contacts, dielectric material 615 (e.g., dielectric material 215/415) that includes the dielectric material layers 615a, 615b over the channel region 610, and a gate electrode 640 (e.g., a gate electrode 140/240/440) coupled to the channel region 610. Like the transistor 400, The transistor 600 differs from the transistor 200 in the presence of two distinct metal layers (a metal layer 452a and a metal layer 452b) between the gate electrode 640 and the channel region 610 as opposed to the single metal layer 252 of the transistor 200. In the transistor 600 both metal layers 652a, 652b conform to the side-walls of the aperture 650, in contrast to the transistor 400 in which the metal layer 452a is limited to the surface of the channel region 410 within the aperture 450 and does not extend along the side-walls of the aperture 450.

The composition of the metal layer 652a may be substantially similar or identical to the composition of the metal layer 452a of the transistor 400. Likewise, the composition of the metal layer 652b may be substantially similar or identical to the composition of the metal layer 452b of the transistor 400. The transistor 600 may be formed using a process substantially similar to the process 300 or a related process. For example, the step 320 may be performed to form the metal layer 652a and an additional identical or similar step may be added afterward to form the metal layer 652b. In one or more embodiments, the metal layers 652a and 652b can be formed by different processes. For instance, the metal layer 652a may be formed using a PVD process and the metal layer 652b may be formed using an ALD process, or vice versa, as nonlimiting examples.

In one or more embodiments, a metal layer such as the metal layer 652a is chosen and configured to have a difference in work function energy with a channel region such as the channel region 610 that results in a sufficient Schottky contact to the channel region. In one or more embodiments, a metal layer such as the metal layer 652b is configured to make a sufficiently Ohmic contact to a metal layer such as the metal layer 652a and to a gate electrode such as the gate electrode 640. In one or more embodiments, the metal layer 652b is chosen and configured to impede atomic diffusion from a gate electrode such as the gate electrode 640 to a channel region such as the channel region 610. In one or more embodiments, a gate electrode 640 is formed from a gold or an alloy containing gold and a metal layer such as the metal layer 652b is configured to impede diffusion of gold atoms from the gate electrode toward a channel region such as the channel region 610.

It will be appreciated that in one or more embodiments a single metal layer (e.g., the metal layer 252) is sufficient to form a Schottky contact to a channel region (e.g., a channel region 210/410/610) and also to impede atomic diffusion from a gate electrode (e.g., a gate electrode 240/440/640) while in one or more other embodiments, a first metal layer (e.g., a metal layer 452a/652a) forms the Schottky contact while a second metal layer (e.g., a metal layer 452b/652b) forms the diffusion barrier.

Examples

Features of embodiments may be understood by way of one or more of the following examples:

Example 1: A transistor or method of fabricating a transistor in which the transistor includes a semiconductor substrate having a top surface and a bottom surface; a first current terminal; a second current terminal; and a channel region. The channel region is formed at a top surface of the semiconductor substrate and includes a semiconductor heterostructure configured to form a two-dimensional electron gas (2DEG) at a buried semiconductor heterojunction within the semiconductor heterostructure. The 2DEG is configured to provide an electrically conductive path between the first current terminal and the second current terminal.

Electrically-insulating material is disposed above the channel region and in direct physical contact with channel region. An aperture in the electrically insulating material is disposed at a location between the first current terminal and the second current terminal. An electrically-conductive control terminal electrically contacts the channel region within the aperture. The control terminal includes: a first metal layer having a first thickness and formed directly above the channel region and a metal gate electrode having a second thickness that is greater than the first thickness disposed above the first metal layer that forms an Ohmic contact to the first metal layer. The first metal layer forms a Schottky contact to the channel region.

Example 2: The transistor or method of Example 1 in which, the control terminal also includes an intermediate metal layer disposed between the first metal layer and the gate electrode. The intermediate metal layer has a third thickness that is less than the second thickness and the intermediate metal layer forms Ohmic contacts with each of the gate electrode and the first metal layer. The intermediate metal layer is configured to impede atomic diffusion from the gate electrode toward the channel region.

Example 3: The transistor of Example 1 or Example 2, in which the gate electrode includes gold and the intermediate metal layer is configured to impede diffusion of gold from the gate electrode into the channel region.

Example 4: The transistor or method any of Examples 1-3, in which the first metal layer is characterized by a first etch rate with respect to a first dry etching process; and the gate electrode is formed of material characterized by an etch rate with respect to the first dry etching process that is significantly faster than the first etch rate, Example 5: The transistor or method any of Examples 1-4 further including an intermediate metal layer disposed between the gate electrode is characterized by a second etch rate with respect to the first dry etching process and the gate electrode is composed of material characterized by an etch rate with respect to the first dry etching process that is significantly faster than the second etch rate.

Example 6: The transistor or method any of Examples 1-5 in which the gate electrode has a first width within the aperture and a second width that is significantly greater than the first width outside the aperture.

Example 7: The transistor or method any of Examples 6 in which the first width is less than one micrometer.

Example 8: The transistor or method any of Examples 1-7 wherein a first metal layer and an intermediate metal layer are conformal with side walls of the aperture.

Example 9: The transistor or method any of Examples 1-8 in which a width of the first metal layer in a direction parallel to the top surface is defined by a width of the gate electrode in the direction parallel to the top surface.

Example 10: The transistor or method any of Examples 2-9 in which a width of the intermediate metal layer in a direction parallel to the top surface is defined by a width of the gate electrode in the direction parallel to the top surface.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The Figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent example functional relationships and/or physical couplings between the various elements. It should be noted that many alternative or additional functional relationships or physical connections may be present in one or more embodiments of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one example arrangement of elements, additional intervening elements, devices, features, or components may be present in one or more embodiments of the depicted subject matter.

What is claimed is:

1. A transistor comprising:
a semiconductor substrate having a top surface and a bottom surface;
a first current terminal;
a second current terminal;
a channel region formed at the top surface of the semiconductor substrate, the channel region comprising a semiconductor heterostructure configured to form a two-dimensional electron gas (2DEG) at a buried semiconductor heterojunction within the semiconductor heterostructure;
electrically-insulating material disposed on the top surface of the semiconductor substrate above the channel region;
an aperture in the electrically-insulating material between the first current terminal and the second current terminal, wherein the aperture is defined by an exposed portion of the top surface of the semiconductor substrate and straight vertical surfaces adjacent to the exposed portion, and the aperture has an aperture width equal to a distance between the vertical surfaces; and
an electrically-conductive control terminal that includes
a first metal layer directly on the exposed portion of the top surface of the semiconductor substrate above the channel region, wherein the first metal layer has a first thickness, the first metal layer extends between the vertical surfaces of the aperture, a width of the first metal layer equals the aperture width, and the first metal layer forms a Schottky contact to the channel region,
an intermediate metal layer disposed between the first metal layer and a metal gate electrode, wherein the intermediate metal layer has a first horizontal portion directly on the first metal layer, second vertical portions that directly contact the vertical surfaces of the aperture, and third horizontal portions that directly contact a top surface of the electrically-insulating material on both sides of the aperture, and wherein the first horizontal portion extends between the vertical surfaces of the aperture, and a width of the first horizontal portion equals the aperture width, and
the metal gate electrode disposed directly on the intermediate metal layer, wherein the metal gate electrode has a lower portion that extends into the aperture, and an upper portion directly on the lower portion, wherein the upper portion is wider than the aperture and extends over and directly contacts the third horizontal portions of the intermediate metal layer,
wherein the intermediate metal layer forms Ohmic contacts with each of the gate electrode and the first metal layer, and
wherein the intermediate metal layer is configured to impede atomic diffusion from the gate electrode toward the channel region.

2. The transistor of claim 1, wherein the gate electrode comprises gold and the intermediate metal layer is configured to impede diffusion of gold from the gate electrode into the channel region.

3. The transistor of claim 1, wherein a width of the intermediate metal layer in a direction parallel to the top surface of the semiconductor substrate is defined by a width of the gate electrode.

4. The transistor of claim 1, wherein a width of the lower portion of the gate electrode is less than one micrometer.

5. A method of fabricating a transistor comprising:
receiving a semiconductor substrate comprising a top surface and a bottom surface, and a channel region formed at the top surface of the semiconductor substrate, the channel region comprising a semiconductor heterostructure configured to form a two-dimensional electron gas (2DEG) at a buried semiconductor heterojunction within the semiconductor heterostructure, wherein the 2DEG is configured to provide an electrically conductive path between a first current terminal and a second current terminal;
forming electrically-insulating material on the top surface of the semiconductor substrate above the channel region and in direct physical contact with the channel region;
forming an aperture in the electrically-insulating material at a location between the first current terminal and the second current terminal, wherein the aperture is defined by an exposed portion of the top surface of the semiconductor substrate and straight vertical surfaces adjacent to the exposed portion, and the aperture has an aperture width equal to a distance between the vertical surfaces; and
forming an electrically-conductive control terminal that electrically contacts the channel region within the aperture, the control terminal comprising:
a first metal layer having a first thickness and formed directly above the channel region on the exposed portion of the top surface of the semiconductor substrate, wherein the first metal layer extends between the vertical surfaces of the aperture, a width of the first metal layer equals the aperture width, and the first metal layer forms a Schottky contact to the channel region,
an intermediate metal layer disposed between the first metal layer and a metal gate electrode, wherein the intermediate metal layer has a first horizontal portion directly on the first metal layer, second vertical portions that directly contact the vertical surfaces of the aperture, and third horizontal portions that directly contact a top surface of the electrically-insulating material on both sides of the aperture, and wherein the first horizontal portion extends between the vertical surfaces of the aperture, and a width of the first horizontal portion equals the aperture width, and wherein the intermediate metal layer forms Ohmic contacts with each of the gate electrode and the first metal layer, and
the metal gate electrode having a second thickness that is greater than the first thickness disposed directly on the intermediate metal layer, wherein the metal gate electrode has a T-shape with a lower portion that extends into the aperture, and an upper portion directly on the lower portion, wherein the upper portion is wider than the aperture and extends over and directly contacts the third horizontal portions of the intermediate metal layer,
wherein the intermediate metal layer is configured to impede atomic diffusion from the metal gate electrode to the channel region.

6. The method of claim 5, wherein a width of the lower portion of the gate electrode is less than one micrometer.

7. The method of claim 5, wherein the intermediate metal layer is conformal with side walls of the aperture.

8. The method of claim 5, further comprising:
performing a first etching process to selectively remove the intermediate metal layer using the gate electrode as an etch mask.

* * * * *